United States Patent
Lee et al.

(10) Patent No.: US 11,152,446 B2
(45) Date of Patent: Oct. 19, 2021

(54) OLED PANEL FOR LIGHTING DEVICE AND METHOD OF MANUFACTURING THE SAME

(71) Applicant: LG Display Co., Ltd., Seoul (KR)

(72) Inventors: Kyu-Hwang Lee, Seoul (KR); Taejoon Song, Paju-si (KR); Chulho Kim, Incheon (KR); Jongmin Kim, Pyeongtaek-si (KR)

(73) Assignee: LG DISPLAY CO., LTD., Seoul (KR)

( * ) Notice: Subject to any disclaimer, the term of this patent is extended or adjusted under 35 U.S.C. 154(b) by 70 days.

(21) Appl. No.: 16/203,285

(22) Filed: Nov. 28, 2018

(65) Prior Publication Data

US 2019/0172891 A1    Jun. 6, 2019

(30) Foreign Application Priority Data

Dec. 5, 2017 (KR) ................ 10-2017-0166179

(51) Int. Cl.
*H01L 27/32* (2006.01)
*H01L 51/50* (2006.01)
(Continued)

(52) U.S. Cl.
CPC ...... *H01L 27/3276* (2013.01); *H01L 51/5012* (2013.01); *H01L 51/5206* (2013.01); *H01L 51/5212* (2013.01); *H01L 51/5221* (2013.01); *H01L 51/5237* (2013.01); *H01L 51/56* (2013.01); *H01L 2251/5361* (2013.01)

(58) Field of Classification Search
None
See application file for complete search history.

(56) References Cited

U.S. PATENT DOCUMENTS

| 2002/0016075 A1* | 2/2002 | Peng ................ H01L 31/1884 438/700 |
| 2006/0118788 A1* | 6/2006 | Park ................ H01L 27/12 257/72 |

(Continued)

FOREIGN PATENT DOCUMENTS

| EP | 3 428 990 A1 | 1/2019 |
| JP | 2005-183209 A | 7/2005 |

(Continued)

*Primary Examiner* — Erik Kielin
(74) *Attorney, Agent, or Firm* — Seed IP Law Group LLP

(57) ABSTRACT

The present application relates to an OLED panel for a lighting device and a method of manufacturing the same. An OLED panel for a lighting device includes: a substrate; a auxiliary wiring pattern having a plurality of wiring lines disposed on the substrate; a first electrode disposed on the substrate where the auxiliary wiring pattern is disposed, and having a planarized upper surface; a passivation layer disposed on the first electrode and disposed at least in an area above the auxiliary wiring pattern; an OLED emission structure disposed on the first electrode; and a second electrode disposed on the OLED emission structure. In the OLED panel for a lighting device, luminance uniformity may be improved through a dual auxiliary wiring pattern, and the upper surface of the first electrode is planarized. Accordingly, the area of the passivation layer is reduced, and thus a light-emitting area may be increased.

10 Claims, 5 Drawing Sheets

(51) Int. Cl.
  *H01L 51/52*  (2006.01)
  *H01L 51/56*  (2006.01)

(56) References Cited

U.S. PATENT DOCUMENTS

| | | |
|---|---|---|
| 2011/0180835 A1 | 7/2011 | Ono et al. |
| 2013/0146908 A1* | 6/2013 | Lin .................... H01L 51/5212 257/98 |
| 2013/0221341 A1* | 8/2013 | Iwabuchi ........... H01L 51/0001 257/40 |
| 2014/0347555 A1* | 11/2014 | Hirakata ................ G03B 15/05 348/371 |
| 2015/0243927 A1 | 8/2015 | Sakaguchi |
| 2015/0287944 A1 | 10/2015 | Amelung et al. |
| 2016/0087245 A1* | 3/2016 | Park .................... H01L 51/5275 257/40 |
| 2016/0172618 A1* | 6/2016 | Chen .................... H01L 51/5212 257/40 |
| 2016/0172619 A1* | 6/2016 | Hwang ............... H01L 51/5209 257/40 |
| 2017/0092891 A1* | 3/2017 | Tanaka ................ H01L 51/5228 |

FOREIGN PATENT DOCUMENTS

| | | |
|---|---|---|
| JP | 2009-59666 A | 3/2009 |
| JP | 2012-49112 A | 3/2012 |
| JP | 2015-220089 A | 12/2015 |
| JP | 2016-524304 A | 8/2016 |
| JP | 2016-192342 A | 11/2016 |
| WO | 2011/016086 A1 | 1/2013 |
| WO | 2014/122938 A1 | 8/2014 |
| WO | 2014/156417 A1 | 10/2014 |

\* cited by examiner

OLED PANEL FOR LIGHTING DEVICE AND METHOD OF MANUFACTURING THE SAME

BACKGROUND

Technical Field

The present disclosure generally relates to a field of lighting, and more particularly, to an organic light-emitting diode (OLED) panel for a lighting device.

Furthermore, the present disclosure relates to a method of manufacturing an OLED panel for a lighting device.

Description of the Related Art

Fluorescent lamps or incandescent lamps are mainly used as lighting devices. For incandescent lamps, a color rendering index is high, but energy efficiency is very low. For fluorescent lamps, while energy efficiency is high, a color rendering index is low. Furthermore, since a fluorescent lamp contains mercury, an environmental problem occurs.

Recently, light-emitting diode (LED) based lighting devices has been suggested. LEDs are formed in a stack structure of nitride semiconductor such as GaN. LEDs have the highest emission efficiency in a blue wavelength range, and the emission efficiency gradually decreases toward a red wavelength range and a green wavelength range having the maximum luminous efficacy. Accordingly, when a white light is emitted by combining a red emission diode, a green emission diode, and a blue emission diode, the emission efficiency may deteriorate. Furthermore, when a red emission diode, a green emission diode, and a blue emission diode are in use, color rendering characteristics may deteriorate because the width of an emission peak of each diode is narrow.

To solve the above problem, instead of combining a red emission diode, a green emission diode, and a blue emission diode, a lighting device that outputs a white light by combining a blue emission diode and yellow phosphor has been suggested. The light device configured as above has been suggested because it is more efficient to use only the blue emission diode having relatively high emission efficiency, instead of using the green emission diode having relatively low emission efficiency, and to use, for the other colors, a phosphor substance emitting a yellow light by receiving a blue light.

However, in the lighting device that outputs a white light by combining a blue emission diode and a yellow phosphor, the phosphor substance for emitting a yellow light has poor emission efficiency. Thus, there has been a limitation in improving the emission efficiency of a lighting device.

In particular, in the case of a nitride semiconductor LED based lighting device, a heat dissipation device is disposed on a rear surface of a lighting device due to a lot of heat generated from a light-emitting diode. Furthermore, there may be a limitation that an expensive sapphire substrate is used for high-quality growth of nitride semiconductor.

Furthermore, in the case of a light-emitting diode based lighting device, there are many processes including an epitaxial growth for growing nitride semiconductor, a chip process for manufacturing individual light-emitting diode chips, and a mounting process for mounting individual light-emitting diode chips on a circuit board.

BRIEF SUMMARY

It is an object of the present disclosure to provide an organic light-emitting diode (OLED) panel for a lighting device.

It is another object of the present disclosure to provide a method of manufacturing an OLED panel.

According to one aspect of the lighting device of the present disclosure, the lighting device provides a uniform voltage across a large sized panel of the device.

According to another aspect of the lighting device of the present disclosure, the lighting device provides a uniform luminance across the large sized panel of the device.

According to another aspect of the lighting device of the present disclosure, the lighting device provides a device having improved emission efficiency.

According to one aspect of the method of manufacturing a lighting device of the present disclosure, the method provides a manufacturing process that involves less steps to lower the overall cost of the manufacture.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an organic light-emitting diode (OLED) panel for a lighting device includes: a substrate; a auxiliary wiring pattern having a plurality of wiring lines disposed on the substrate; a first electrode disposed on the substrate where the auxiliary wiring pattern is disposed, and having a planarized upper surface; a passivation layer disposed on the first electrode and disposed at least in an area above the auxiliary wiring pattern; an OLED emission structure disposed on the first electrode; and a second electrode disposed on the OLED emission structure.

In accordance with another aspect of the present disclosure, an organic light-emitting diode (OLED) panel for a lighting device includes: a substrate having an array area and a pad area; an auxiliary wiring pattern having a plurality of wiring lines disposed in the array area and the pad area on the substrate; a first electrode disposed in the array area on the substrate where the auxiliary wiring pattern is disposed; a passivation layer disposed on the auxiliary wiring pattern; an OLED emission structure disposed on the first electrode; and a second electrode disposed on the OLED emission structure, wherein the passivation layer is directly contacted with the auxiliary wiring pattern in the pad area.

In accordance with another aspect of the present disclosure, a method of manufacturing an organic light-emitting diode (OLED) panel for a lighting device includes: disposing an auxiliary wiring pattern forming material on a substrate; forming an auxiliary wiring pattern by etching the auxiliary wiring pattern forming material to leave a plurality of wiring lines that make up the pattern; disposing a first electrode on the substrate where the auxiliary wiring pattern is disposed, by a coating method, wherein the first electrode has a planarized upper surface; disposing a passivation layer on the first electrode such that the passivation layer is disposed at least in an area above the auxiliary wiring pattern; disposing an OLED emission structure on the first electrode; and disposing a second electrode on the OLED emission structure.

In accordance with one aspect of the present disclosure, an OLED panel for a lighting device according to an embodiment may include a substrate, a first auxiliary wiring pattern, a second auxiliary wiring pattern, a first electrode, a passivation layer, an OLED emission structure, a second electrode, and an encapsulation layer.

The first auxiliary wiring pattern may be disposed on the substrate, and the second auxiliary wiring pattern may be disposed on the first auxiliary wiring pattern. The first electrode may be disposed on the substrate where the first auxiliary wiring pattern and the second auxiliary wiring pattern are disposed, and may have a planarized upper surface. The passivation layer may be disposed on the first electrode, and arranged at least in an area where the first auxiliary wiring pattern is disposed. The OLED emission structure may be disposed on the first electrode where the passivation layer is disposed. The second electrode may be disposed on the OLED emission structure. The encapsulation layer may be disposed on the second electrode.

According to the above structure, the OLED panel for a lighting device according to the present disclosure includes a dual auxiliary wiring pattern. Furthermore, the upper surface of the first electrode is planarized. Accordingly, due to the dual auxiliary wiring pattern, the voltage applied to the first electrode may be overall uniform. Thus, luminance uniformity may be improved. Furthermore, since the upper surface of the first electrode is planarized, the area of the passivation layer above the first electrode may be reduced, and thus a light-emitting area may be increased.

Furthermore, the first auxiliary wiring pattern may have a cross-section of a taper shape having a width decreasing toward the upper side thereof, and the second auxiliary wiring pattern may have a cross-section of a rectangular shape. The stack structure of the first auxiliary wiring pattern and the second auxiliary wiring pattern may provide structural stability.

In this state, the first auxiliary wiring pattern may include a metal material, and the second auxiliary wiring pattern may include a transparent conductive oxide material. In the case of a transparent conductive oxide (TCO), a laser heat treatment may be available, and uncrystallized TCO and metal may be removed by one-time wet etching using an etchant including oxalic acid.

The first electrode may include a TCO material, a conductive polymer material, or a conductive carbon based material. The coating method may be applied to the electrode materials.

In accordance with another aspect of the present disclosure, a method of manufacturing an OLED panel for a lighting device according to an embodiment includes disposing a first auxiliary wiring pattern forming material on a substrate and disposing a second auxiliary wiring pattern forming material on the first auxiliary wiring pattern forming material; forming a first auxiliary wiring pattern and a second auxiliary wiring pattern on the first auxiliary wiring pattern by etching the second auxiliary wiring pattern forming material and the first auxiliary wiring pattern forming material; disposing a first electrode on the substrate where the first auxiliary wiring pattern and the second auxiliary wiring pattern are disposed, by a coating method; disposing a passivation layer on the first electrode such that the passivation layer is disposed at least in an area above the first auxiliary wiring pattern and the second auxiliary wiring pattern; disposing an OLED emission structure on the first electrode where the passivation layer is disposed; disposing a second electrode on the OLED emission structure; and disposing an encapsulation layer on the second electrode.

Through the above processes, a dual auxiliary wiring pattern may be formed, and the first electrode having a planarized upper surface may be formed.

In this state, the first auxiliary wiring pattern forming material may be a metal material, and the second auxiliary wiring pattern forming material may be an uncrystallized TCO material. In the above stack structure, the first auxiliary wiring pattern and the second auxiliary wiring pattern may be easily formed through a laser heat treatment and etching, which are described later.

When the first auxiliary wiring pattern forming material is a metal material, and the second auxiliary wiring pattern forming material is an uncrystallized TCO material, the disposing of the first auxiliary wiring pattern and the second auxiliary wiring pattern may include disposing a mask having an opening on an uncrystallized TCO, crystallizing TCO in the opening portion of the mask by irradiating a laser beam to the uncrystallized TCO where the mask is disposed, removing the mask, and etching the uncrystallized TCO and the first auxiliary wiring pattern forming material under the uncrystallized TCO.

A part of the uncrystallized TCO may be crystallized through a laser heat treatment, and the uncrystallized TCO and the metal thereunder may be removed by wet etching using an etchant including oxalic acid.

Furthermore, due to the above wet etching, the first auxiliary wiring pattern may have a cross-section of a taper shape having a width decreasing toward the upper side thereof, and the second auxiliary wiring pattern may have a cross-section of a rectangular shape.

The first electrode may include a TCO material, a conductive polymer material, or a conductive carbon based material. The above materials may be electrode materials that may be formed by a coating method. Among the materials, an electrode of the TCO material may be formed by a sol-gel method, and an electrode of the conductive polymer material such as PEDOT or an electrode of a conductive carbon material such as carbon nanotube may be formed by a slurry coating and drying process.

Furthermore, according to the coating method, no mask is used for forming the first electrode, and furthermore the first electrode having a planarized upper surface may be formed. When the passivation layer is formed on the planarized upper surface, the passivation layer may be formed in the same shape as the forming a wiring pattern on the substrate, and thus an area of the passivation layer may be reduced. Accordingly, a light-emitting area may be increased.

DETAILED DESCRIPTION

Hereinafter, an OLED panel for a lighting device according to the present disclosure, and a manufacturing method thereof, will be described in detail with reference to the accompanying drawings.

Terms such as "first" and "second" are used herein merely to describe a variety of constituent elements, but the constituent elements are not limited by the terms. Such terms are used only for the purpose of distinguishing one constituent element from another constituent element.

Furthermore, in the present disclosure, when a constituent element is disposed "above" or "on" to another constituent element, the constituent element may be only directly on the other constituent element, through at least one of other constituent elements, e.g., a third constituent element, or above the other constituent elements in a non-contact manner, or above the other constituent elements in a contact manner.

Figure 1:
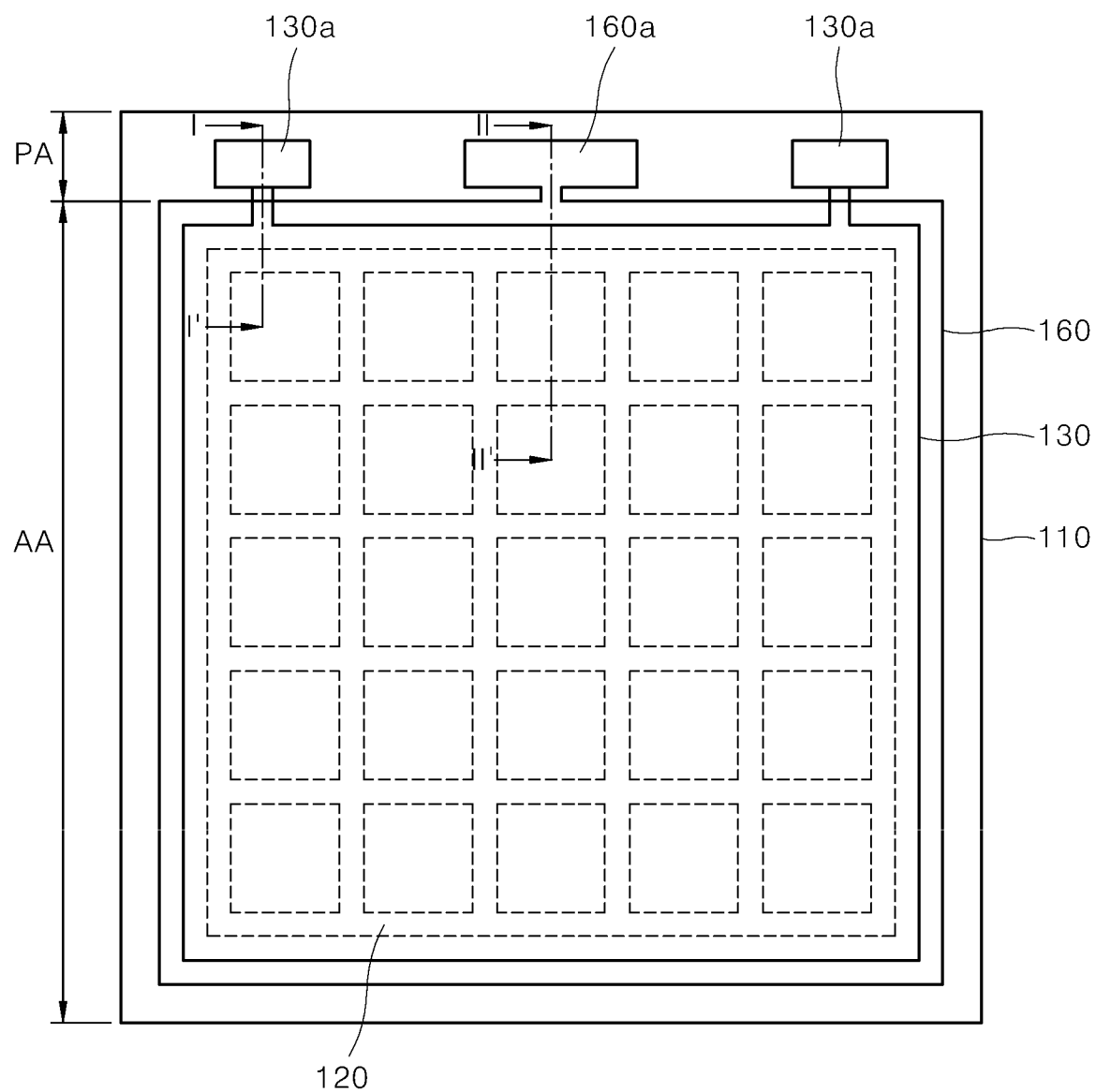
FIG. 1 is a schematic plan view of an OLED panel for a lighting device according to the present disclosure.
Figure 2:
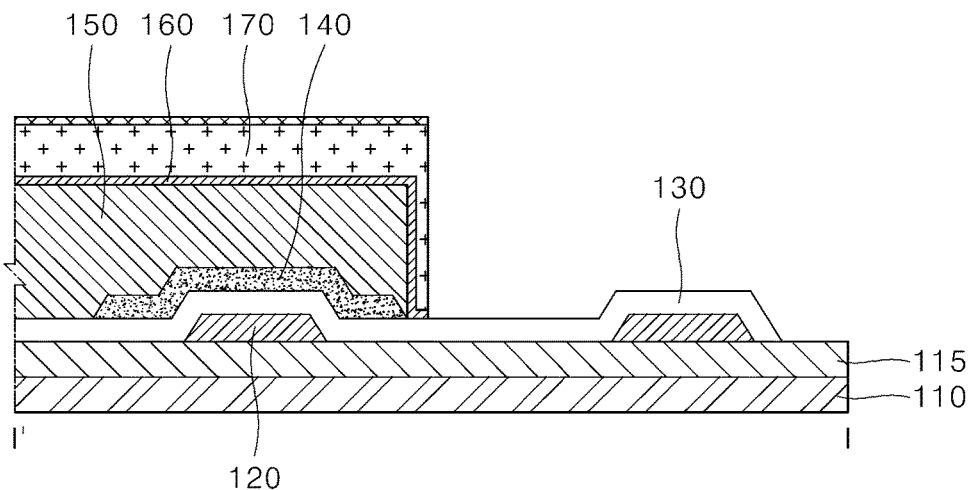
FIG. 2 is a cross-sectional view taken along line I-I' of FIG. 1

FIG. 1 is a schematic plan view of an OLED panel for a lighting device according to the present disclosure. FIG. 2 is a cross-sectional view taken along line I-I' of FIG. 1.

Referring to FIGS. 1 and 2, the OLED panel for a lighting device according to the present disclosure may include a substrate 110, an auxiliary wiring pattern 120, a first electrode 130, a passivation layer 140, an OLED emission structure 150, a second electrode 160, and an encapsulation layer 170.

The substrate 110 may be a glass substrate or a polymer substrate. A buffer layer 115 such as $SiO_2$ or $SiN_x$ may be formed on the substrate 110. When a polymer substrate is used as the substrate 110, the OLED panel for a lighting device may be manufactured by a roll-to-roll process due to the flexibility characteristics of the polymer substrate.

Figure 3:
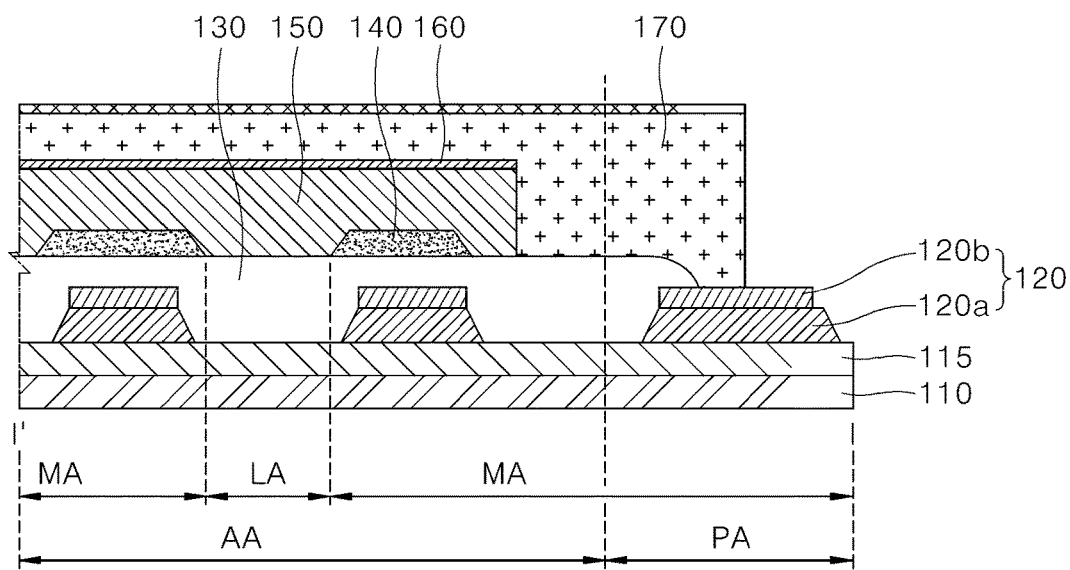
FIG. 3 is a cross-sectional view taken along line I-I' of FIG. 1, according to one embodiment of the present disclosure.

The substrate 110 may include an array area AA and a pad area PA. Referring to FIG. 3, which is described later, the array area AA may include a light-emitting area LA and a wiring area MA. The light-emitting area LA may be an area in which a first electrode, for example, an anode electrode, is disposed under the OLED emission structure 150 and a second electrode, for example, a cathode electrode, is disposed above the OLED emission structure 150.

The auxiliary wiring pattern 120 is disposed on the substrate 110. The auxiliary wiring pattern 120 may include a plurality of auxiliary wiring lines. In one embodiment, the plurality of auxiliary wiring lines form a pattern and is overlain on the substrate 110. In another embodiment, the lines of the auxiliary wiring pattern 120 are patterned to be spaced apart from each other. For example, the plurality of auxiliary wiring lines forming the auxiliary wiring pattern 120 may be spaced away from each of the plurality of auxiliary wiring lines.

The auxiliary wiring pattern 120 functions as follows. The first electrode 130 may be generally formed of a transparent conductive oxide (TCO) material such as indium tin oxide (ITO) or fluorine-doped tin oxide (FTO). The TCO material may have a merit of transmitting the light emitted from the OLED emission structure 150 and also have a demerit of having very high electrical resistance compared to metal. Accordingly, when a large sized OLED panel for a lighting device is manufactured, a distribution of applied voltages is irregular across the overall first electrode due to high resistance of the TCO. Such irregular voltage distribution may deteriorate luminance uniformity of a large sized lighting device.

Accordingly, the auxiliary wiring pattern 120 is formed of a material having resistance lower than the TCO, for example, metal. Thus, the auxiliary wiring pattern 120 functions to allow the distribution of a voltage applied to the first electrode 130 that is formed in contact with the auxiliary wiring pattern 120 to be entirely uniform over the first electrode 130.

Although the auxiliary wiring pattern 120 may have a net shape, the present disclosure is not limited thereto. Furthermore, although the auxiliary wiring pattern 120 may have a shape close to a left to right symmetry, the present disclosure is not limited thereto.

The auxiliary wiring pattern 120 may have a taper shape having a width decreasing toward the upper side thereof. Accordingly, the first electrode 130 may be stably disposed on the auxiliary wiring pattern 120. Any shape suitable for stably disposing the first electrode 130 on the auxiliary wiring pattern 120 may be devised by a person skilled in the art. In one embodiment, one cross-section of the auxiliary wiring pattern 120 may have a taper shape but in other embodiments, the shape may be rectangular, and is not necessarily limited to a taper shape.

The first electrode 130 is disposed on the substrate 110 on which the auxiliary wiring pattern 120 is disposed, and is connected to a first electrode pad 130a. The first electrode 130 may be formed of a TCO material such as ITO, and may be formed by sputtering process or coating process.

The passivation layer 140 is disposed on the first electrode 130, at least in an area where the auxiliary wiring pattern 120 is disposed. When, in OLED lighting, short circuit is generated between the first electrode 130 and the second electrode 160, luminance degradation may occur not only in a shorted portion but also in an entire panel due to current drop. To prevent the above, the passivation layer 140 is formed at least above the auxiliary wiring pattern 120.

The passivation layer 140 may be formed of an organic material such as polyimide based material, or an inorganic material such as alumina ($Al_2O_3$) or silicon nitride ($SiN_x$). In detail, a passivation material may include an organic material such as polyimide, or an inorganic material such as alumina or silicon nitride. The passivation material may be deposited by an atomic layer deposition (ALD) method or a chemical vapor deposition (CVD) method.

The OLED emission structure 150 may be disposed on the first electrode 130 where the passivation layer 140 is disposed.

The OLED emission structure 150 may include an organic emission layer (EML), a hole injection layer (HIL) and/or a hole transport layer (HTL) for providing holes to the organic emission layer, and an electron transport layer (ETL) and/or an electron injection layer (EIL) for providing electrons to the organic emission layer.

The second electrode 160 is disposed on the OLED emission structure 150 and connected to a second electrode pad 160a. The second electrode 160 may be formed of a TCO material such as ITO or a metal material.

The encapsulation layer 170 is disposed on the second electrode 160 and prevents intrusion of external moisture or air. The encapsulation layer 170 may be formed of an organic material such as an acrylate based compound or an epoxy based compound, an inorganic material such as ceramic or metal, or an organic/inorganic composite material, and may be formed in a monolayer structure or a multilayer structure.

Although FIG. 2 illustrates an example in which the encapsulation layer 170 is formed only on the second electrode 160, to improve moisture intrusion prevention effect, the encapsulation layer 170 may be formed on a surface of each elements 120 to 160 formed in the array area.

A barrier film or a protection film may be additionally disposed on the encapsulation layer 170 via an adhesive layer, the barrier film and the protection film may prevent the intrusion of external moisture or air. The protection film may be a PET substrate or metal foil.

The first electrode pad 130a and the second electrode pad 160a are described below.

The first electrode pad 130a is connected to the first electrode 130. The second electrode pad 160a is connected to the second electrode 160. Although FIG. 1 illustrates an example in which the second electrode pad 160a is disposed at a center portion of the pad area PA and the first electrode pads 130a are disposed at both sides of the second electrode pad 160a, the arrangement, size, and number of electrode pads may be changed as necessary.

The first electrode pad 130a may include a lower layer of the same material as the auxiliary wiring pattern 120 and an upper layer of the same material as the first electrode 130. The lower layer may be simultaneously formed with the auxiliary wiring pattern 120, and may be directly connected to the auxiliary wiring pattern 120. The upper layer may be simultaneously formed with the first electrode 130. When the lower layer is directly connected to the auxiliary wiring pattern 120, the upper layer does not need to be directly connected to the first electrode 130.

Furthermore, the second electrode pad 160a may include a lower layer of the same material as the auxiliary wiring pattern 120 and an upper layer of the same material as the second electrode 160. While the lower layer may be simultaneously formed with the auxiliary wiring pattern 120, the upper layer may be simultaneously formed with the second electrode 160.

However, in the case of the OLED panel for a lighting device illustrated in FIG. 2, the first electrode 130 is formed by a deposition method and has a cross-section corresponding to the auxiliary wiring pattern 120 thereunder. Accordingly, a plane surface of the first electrode 130 is not substantially flat.

Accordingly, the passivation layer 140 formed on the first electrode 130 also has a cross-section corresponding to the cross-section of the first electrode 130, and thus an area taken by the passivation layer 140 is relatively large. Since a portion where the passivation layer 140 is disposed is mainly in the wiring area MA, which corresponds to a non-light-emitting area, to increase the area of the light-emitting area LA, the area of the passivation layer 140 is decreased.

Figure 4:
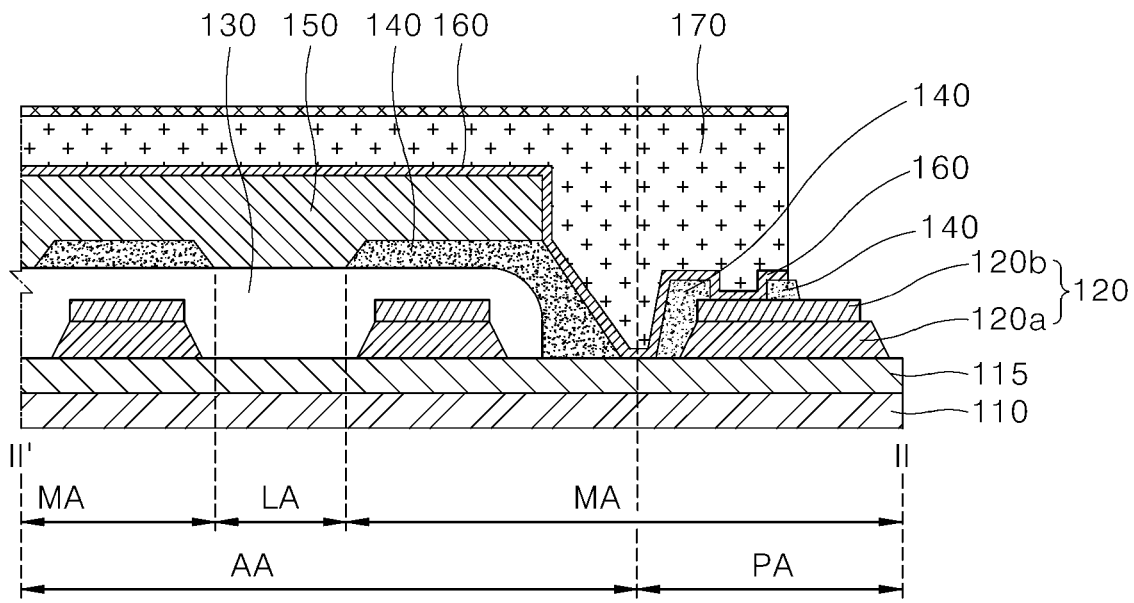
FIG. 4 is a cross-sectional view taken along line II-II' of FIG. 1, according to one embodiment of the present disclosure.

FIG. 3 is a cross-sectional view taken along line I-I' of FIG. 1, according to one embodiment of the present disclosure. FIG. 4 is a cross-sectional view taken along line II-II' of FIG. 1, according to one embodiment of the present disclosure.

Referring to FIGS. 3 and 4, the first electrode 130 has a planarized upper surface. Accordingly, the passivation layer 140 formed on the first electrode 130 may have a sectional shape corresponding to, for example, the auxiliary wiring pattern 120 of FIG. 2. When the cross-section of the passivation layer 140 illustrated in FIGS. 3 and 4 is compared with the cross-section of the passivation layer 140 illustrated in FIG. 2, it may be seen that the area of the passivation layer 140 of FIGS. 3 and 4 is smaller than that of the passivation layer 140 of FIG. 2.

The first electrode 130 having a flat upper surface may be formed by a coating method. A process of forming the first electrode 130 by the coating method is described later with reference to FIG. 5.

Furthermore, referring to FIG. 4, in the PA, the auxiliary wiring pattern 120 is disposed on the substrate 110, and a passivation layer 140 is disposed on the auxiliary wiring pattern 120 and is directly contacted with the auxiliary wiring pattern 120. Moreover, a second electrode 160 is disposed on the passivation layer 140 and an encapsulation layer 170 is disposed on the second electrode 160.

In the example of FIGS. 3 and 4, the first electrode 130 may be formed of a TCO material, a conductive polymer material, or a conductive carbon based material. A solution process, that is, a coating method, such as a sol-gel method or a slurry coating method, may be applied to the electrode materials.

Furthermore, referring to FIGS. 3 and 4, the auxiliary wiring pattern 120 may include a first auxiliary wiring pattern 120a and a second auxiliary wiring pattern 120b. The first auxiliary wiring pattern 120a may be formed of a metal material, and the second auxiliary wiring pattern 120b may be formed of a TCO material. The second auxiliary wiring pattern 120b may serve as anti-oxidation of the first auxiliary wiring pattern 120a. In the case of TCO, laser heat treatment is available, and TCO that is not crystallized and metal may be removed by one-time wet etching using an etchant including oxalic acid. Furthermore, in this case, since crystallized TCO functions as a mask, a separate mask is not needed in an etching process.

When the first auxiliary wiring pattern 120a is formed of a TCO material, and the second auxiliary wiring pattern 120b is formed of a metal material, crystallization of TCO by the laser heat treatment may be difficult.

Furthermore, the first auxiliary wiring pattern 120a has a cross-section having a taper shape having a width decreasing toward an upper side thereof, and the second auxiliary wiring pattern 120b may have a rectangular cross-section. The approximately rectangular cross-sectional shape of the second auxiliary wiring pattern 120b may result from the laser heat treatment, and the tapered cross-sectional shape of the first auxiliary wiring pattern 120a may result from the wet etching. A stacked structure of the first auxiliary wiring pattern 120a and the second auxiliary wiring pattern 120b as above may provide structural stability.

Any shape suitable for providing structural stability may be devised by a person skilled in the art for the first auxiliary wiring pattern 120a and the second auxiliary wiring pattern 120b. In one embodiment, one cross-section of the first auxiliary wiring pattern 120a may have a taper shape but in other embodiments, the shape may be rectangular, and is not necessarily limited to this shape as long as it can provide structural stability. The cross-section of the second auxiliary wiring pattern 120b may also have different shapes that provide structural stability.

An exemplary method of manufacturing an OLED panel for a lighting device according to one embodiment of the present disclosure is described with reference to FIGS. 5A to 5G.

In accordance with an embodiment of the present disclosure, a method of manufacturing an OLED panel for a lighting device includes disposing an auxiliary wiring pattern forming material on a substrate; forming an auxiliary wiring pattern by etching the auxiliary wiring pattern forming material; disposing a first electrode on the substrate where the auxiliary wiring pattern is disposed, by a coating method, wherein the first electrode has a planarized upper surface; disposing a passivation layer on the first electrode such that the passivation layer is disposed at least in an area above the auxiliary wiring pattern; disposing an OLED emission structure on the first electrode; and disposing a second electrode on the OLED emission structure.

Further, in accordance with an embodiment of the present disclosure, the auxiliary wiring pattern forming material includes a first auxiliary wiring pattern forming material and a second auxiliary wiring pattern forming material, the first auxiliary wiring pattern forming material includes a metal material, and the second auxiliary wiring pattern forming material includes an uncrystallized transparent conductive oxide material, the auxiliary wiring pattern includes a first auxiliary wiring pattern and a second auxiliary wiring pattern, and the forming of the auxiliary wiring pattern includes the forming of the first auxiliary wiring pattern and the second auxiliary wiring pattern, and the forming of the first auxiliary wiring pattern and the second auxiliary wiring pattern includes: disposing a mask having an opening on the uncrystallized transparent conductive oxide; crystallizing the uncrystallized transparent conductive oxide in the opening portion of the mask by irradiating a laser beam to the mask; removing the mask; and etching the uncrystallized transparent conductive oxide in a portion of the mask which is not the opening portion and the first auxiliary wiring pattern forming material under the uncrystallized transparent conductive oxide in the portion of the mask which is not the opening portion.

Figure 5A:
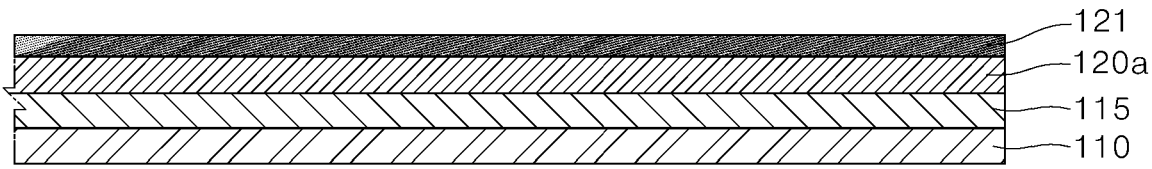
FIGS. 5A to 5G illustrate an exemplary method of manufacturing an OLED panel for a lighting device, according to one embodiment of the present disclosure.

First, in an example illustrated in FIG. 5A, a first auxiliary wiring pattern forming material 120a is disposed on the substrate 110 to form the first auxiliary wiring pattern 120a. The first auxiliary wiring pattern forming material 120a may include a metal material such as Cu or Al. When the first auxiliary wiring pattern forming material 120a is metal, the first auxiliary wiring pattern 120a may be formed of a metal material. Accordingly, the same reference as the first auxiliary wiring pattern 120a is used for the first auxiliary wiring pattern forming material 120a.

Then, a second auxiliary wiring pattern forming material 121 for forming the second auxiliary wiring pattern 120b is disposed on the first auxiliary wiring pattern forming material 120a. The second auxiliary wiring pattern forming material 121 may be a TCO material in a non-crystallized state, that is, in an amorphous state. A TCO may include ITO or FTO, the present disclosure is not limited thereto.

Next, by etching the second auxiliary wiring pattern forming material 121 and the first auxiliary wiring pattern forming material 120a, the first auxiliary wiring pattern 120a and the second auxiliary wiring pattern 120b on the first auxiliary wiring pattern 120a are formed.

Figure 5B:
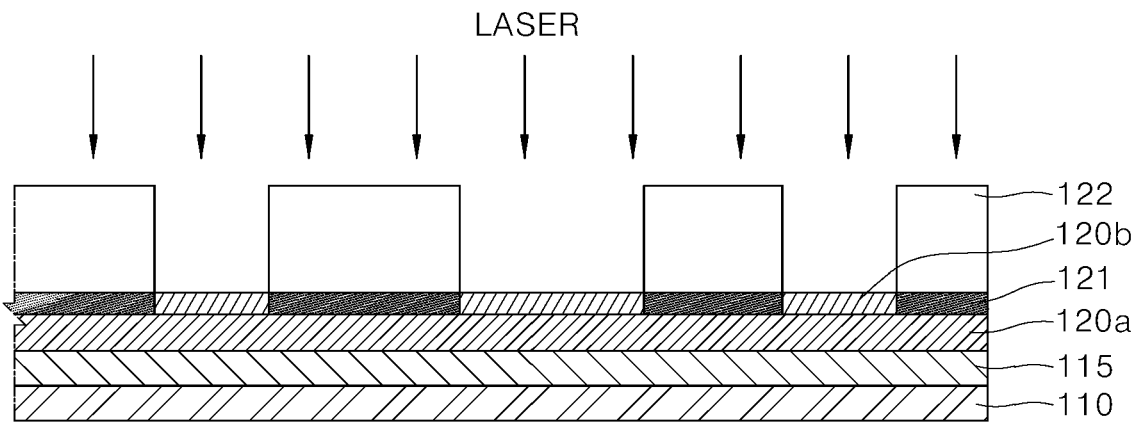
Figure 5C:
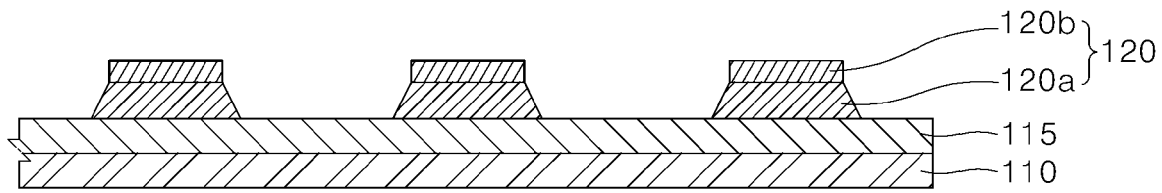

In this state, when the first auxiliary wiring pattern forming material 120a is metal and the second auxiliary wiring pattern forming material 121 is a TCO material, the process illustrated in FIGS. 5B and 5C may be performed. In FIGS. 5B and 5C, metal that is the first auxiliary wiring pattern forming material 120a is assigned with a reference numeral 120a, and the uncrystallized TCO that is the second auxiliary wiring pattern forming material 121 is assigned with a reference numeral 121. Furthermore, the crystallized TCO corresponding to the second auxiliary wiring pattern 120b is assigned with a reference numeral 120b.

First, in an example illustrated in FIG. 5B, a mask 122 having an opening is arranged and then a laser beam is irradiated thereon. Accordingly, the TCO 121 that is not crystallized under the opening of the mask 122 is locally heated and converted to the TCO 120b that is crystallized. The laser beam used for crystallizing the TCO 121 that is not crystallized may be irradiated with energy of about 5 to 10 J/cm$^2$.

Then, in an example illustrated in FIG. 5C, the mask 122 is removed, and the TCO 121 that is not crystallized and the metal 120a thereunder are etched using an etchant including oxalic acid. In this state, when the etchant such as oxalic acid or acetic acid has etching characteristics to all of the TCO 121 that is not crystallized and the metal 120a, the TCO 121 that is not crystallized and the metal 120a thereunder may be all etched by one-time wet etching.

After the laser crystallization, the TCO 121 that is not crystallized is first wet-etched using an etchant having etching characteristics to the uncrystallized TCO, and thus the metal 120a that is exposed thereunder according to the etching of the TCO 121 that is not crystallized may be etched by a wet etching method using a different etchant or a dry etching method.

As a result of the laser heat treatment and the wet etching, the first auxiliary wiring pattern 120a has a cross-section of a taper shape having a width decreasing toward the upper side thereof, and the second auxiliary wiring pattern 120b may have a cross-section of a rectangular shape.

When the laser heat treatment is used, due to linearity of a laser beam, a crystallized portion and an uncrystallized portion approximately make perpendicular planes, a cross-section of the second auxiliary wiring pattern 120b of the crystallized TCO material may be an approximately rectangular shape. Furthermore, since the etching of the metal under the uncrystallized TCO is performed in the same manner as performing wet etching using the crystallized TCO, that is, the second auxiliary wiring pattern 120b, as a mask, the first auxiliary wiring pattern 120a may have a taper shape having a width decreasing toward the upper side thereof.

Figure 5D:
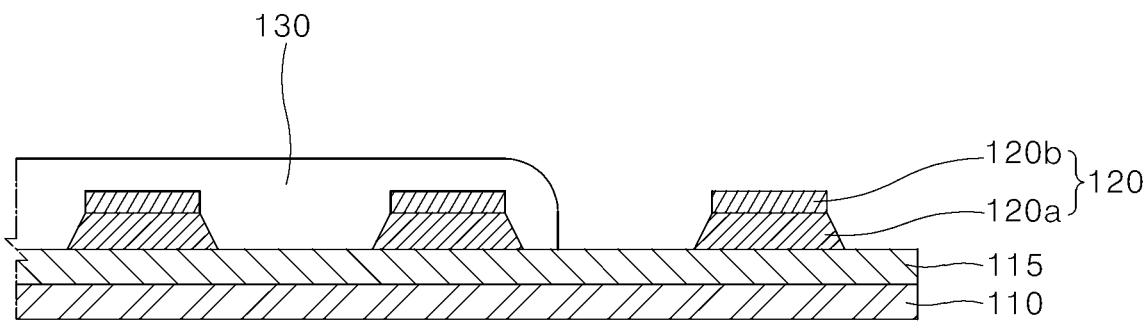

Next, in an example illustrated in FIG. 5D, the first electrode 130 is disposed on the substrate 110 where the first auxiliary wiring pattern 120a and the second auxiliary wiring pattern 120b are disposed.

As illustrated in the example, the first electrode 130 may have a planarized upper surface. This may be obtained by forming the first electrode 130 in the coating method.

Furthermore, the first electrode 130 may be entirely formed in the array area AA, and may be additionally formed in contact with the first electrode pad 130a.

An electrode material to which the coating method may be applied may include TCO such as ITO, poly(3,4-ethylenedioxythiophene) (PEDOT), a conductive polymer material such as polypyrrole, polythiophene polysulfonenitride, or a conductive carbon based material such as carbon nanotube or graphene.

The coating method is a method of performing coating based on a solution process such as a sol-gel method or a slurry coating method. Among the methods, in the case of the sol-gel method, precursor sol is coated on a substrate and heated to be converted a gel phase, which may be used for forming TCO such as ITO. Furthermore, in the case of the slurry coating method, slurry including the electrode material, a binder, and a solvent is coated on a substrate and dried.

Figure 5E:
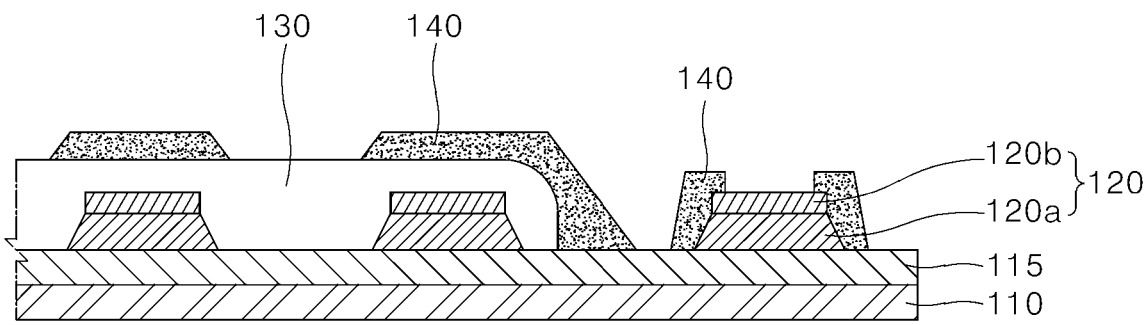

Next, in an example illustrated in FIG. 5E, the passivation layer 140 is disposed on the first electrode 130. In this state, the passivation layer 140 is disposed at least in an area above the first auxiliary wiring pattern 120a and the second auxiliary wiring pattern 120b. Furthermore, the passivation layer 140 may be additionally formed by encompassing a part of the first electrode 130. This is to allow the second electrode 160 to be connected to the second electrode pad 160a. In another embodiment, the passivation layer 140 formed by encompassing a part of the first electrode 130 may be spaced apart from the passivation layer 140 on the first auxiliary wiring pattern 120a and the second auxiliary wiring pattern 120b. The encompassing part of the passivation layer 140 may cover the side surface and any other curvature surface of the first electrode 130. The encompassing part of the passivation layer 140 may contact the buffer layer 115 but may be spaced apart from the adjacent passivation layer 140. For example, the passivation layer 140 may cover the top surface of the first electrode 130 and the side surface of the first electrode 130 to contact the buffer layer 115. This passivation layer 140 may be spaced apart from the passivation layer 140 partially covering the top surface of the second auxiliary wiring pattern 120b and the side surface of the first auxiliary wiring pattern 120a to expose a portion of the buffer layer 115.

Figure 5F:
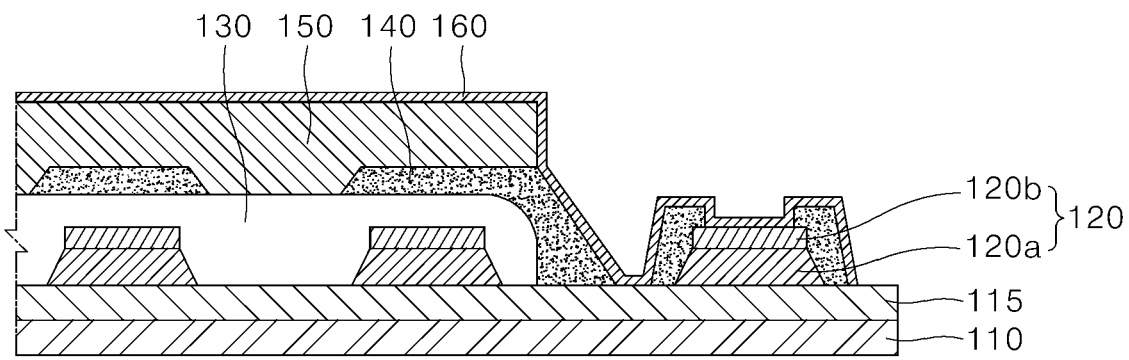

Then, in an example illustrated in FIG. 5F, the OLED emission structure 150 is disposed on the first electrode 130 where the passivation layer 140 is disposed. Each layer of the OLED emission structure 150 may be formed by depositing an organic material, for example, copperphthalocyanine (CuPc), N,N'-Di(naphthalene-1-yl)-N,N'-diphenylbenzidine (NPB), or tris-8-hydroxyquinoline aluminum (Alq3), in a vacuum deposition method.

Then, the second electrode 160 is disposed on the OLED emission structure 150. The second electrode 160 may be formed of metal or a TCO material. The second electrode 160 may be entirely formed in the array area AA, and may be further formed to contact the second electrode pad 160a of FIG. 1. In another embodiment, the second electrode 160 may be on the OLED emission structure 150, the passivation layer 140, the buffer layer 150, and the auxiliary wiring pattern 120. For example, the second electrode 160 may cover the top and side surface of the OLED emission structure 150, the side surface of the passivation layer 140, the buffer layer 150, and a portion of the top surface of the second auxiliary wiring pattern 120b of the auxiliary wiring pattern 120.

After the second electrode 160 is formed, as necessary, a process of aging the OLED emission structure 150 may be further performed by applying an aging voltage to the OLED emission structure 150.

An organic light-emitting material may have a short life and may be vulnerable to moisture or air, or when a high voltage or high current is applied to the organic light-emitting material, a device may be damaged. Furthermore, since the interface properties between the first and second electrodes 130 and 160 and the OLED emission structure 150 are not good, the characteristics of a device may be unstable. Furthermore, when the second electrode 160 is formed, impurities are accumulated in the OLED emission structure 150, and thus the light-emitting characteristics and the color of an organic material may be degraded. To solve the problems, the OLED emission structure 150 may be aged in a short time by applying an aging voltage of a high voltage to the OLED emission structure 150. In this state, the aging voltage may be a high voltage greater than the voltage applied to the first electrode 130 and the second electrode 160. In another example, the aging voltage may be a reverse voltage to the voltage applied to the first electrode 130 and the second electrode 160.

Figure 5G:
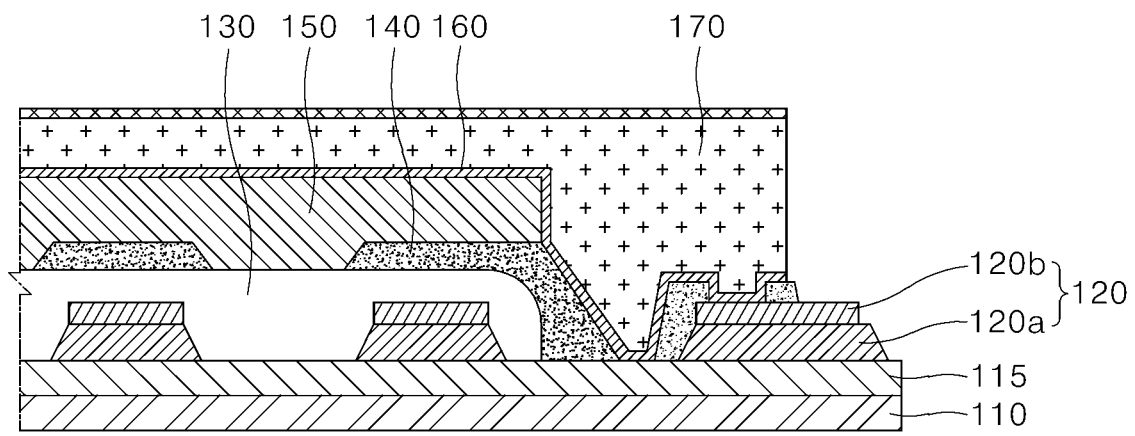

Then, in an example illustrated in FIG. 5G, the encapsulation layer 170 is disposed on the second electrode 160. The encapsulation layer 170 may be formed of an organic material such as an acrylate compound, an inorganic material such as ceramic or metal, or an organic/inorganic composite material.

Furthermore, as necessary, a protection film or a barrier film may be further formed on the encapsulation layer 170.

As described above, according to the present disclosure, the OLED panel for a lighting device according to the present disclosure includes a dual auxiliary wiring pattern, and thus anti-oxidation effect of the first auxiliary wiring pattern may be obtained. Accordingly, a uniform voltage may be applied entirely to the first electrode, and thus luminance uniformity may be improved. Furthermore, according to the present disclosure, the first electrode may be formed by the coating method, and thus the first electrode having a planarized upper surface may be formed. Accordingly, since the area of the passivation layer above the first electrode may be reduced, a light-emitting area may be increased.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lighting device including an array area and a pad area, the device comprising:
    a substrate;
    a plurality of auxiliary wiring patterns on the substrate, the plurality of auxiliary wiring patterns spaced apart from each other;
    a first electrode on at least one of the plurality of auxiliary wiring patterns, and a top surface of the first electrode having a planar surface in the entire array area;
    a passivation layer on at least one of the plurality of the auxiliary wiring patterns, the passivation layer including a plurality of portions spaced apart from each other;
    a light emission structure on the first electrode in the array area;
    a second electrode disposed on the light emission structure;
    a first electrode pad connected to the first electrode in the pad area;
    a second electrode pad connected to the second electrode in the pad area; and
    an encapsulation layer disposed on the second electrode;
    wherein a first electrode pad and a second electrode pad are of a same material as the auxiliary wiring pattern, the first electrode covers a part of an upper surface of the first electrode pad, and
    the second electrode directly contacts the second electrode pad through a contact hole in the passivation layer on the second electrode pad,
    wherein each of the first electrode pad and the second electrode pad includes a first auxiliary wiring pattern and a second auxiliary wiring pattern, the first auxiliary wiring pattern is on the substrate and the second auxiliary wiring pattern is on the first auxiliary wiring pattern, and wherein the encapsulation layer covers an edge of the first electrode on the first electrode pad, and directly contacts the first auxiliary wiring pattern of the first electrode pad.

2. The lighting device of claim 1, wherein the plurality of auxiliary wiring patterns includes the first auxiliary wiring pattern and the second auxiliary wiring pattern.

3. The lighting device of claim 1, at least one of the plurality of portions of the passivation layer overlapping at least one of the plurality of auxiliary wiring patterns.

4. The lighting device of claim 1, at least one of the plurality of portions of the passivation layer being on the first electrode and overlapping at least one of the plurality of auxiliary wiring patterns and extending to a first surface of the first electrode.

5. The lighting device of claim 3,
wherein the second electrode overlaps at least one of the plurality of portions of the passivation layer and at least one of the plurality of auxiliary wiring patterns.

6. The lighting device of claim 4, further comprising:
buffer layer on the substrate, the buffer layer being between the substrate and the plurality of auxiliary wiring patterns,
wherein the second electrode covers a second surface of the at least one of the plurality of portions of the passivation layer, and contacts the buffer layer.

7. The lighting device of claim 6, wherein the second surface of the at least one of the plurality of portions of the passivation layer includes a side surface transverse from a top surface of the passivation layer, the top surface of the passivation layer including a planar surface.

8. The lighting device of claim 1, wherein the first auxiliary wiring pattern has a cross-section of a taper shape having a width decreasing toward the second auxiliary wiring pattern.

9. The lighting device of claim 1, the first auxiliary wiring pattern and the second auxiliary wiring pattern are formed with different materials, and the first auxiliary wiring pattern includes a metal material, and the second auxiliary wiring pattern includes a transparent conductive oxide material.

10. The lighting device of claim 1,
wherein a cross-section of the passivation layer has a taper shape having a width decreasing toward the second electrode.

* * * * *